(12) United States Patent
Ingram

(10) Patent No.: US 10,637,394 B2
(45) Date of Patent: Apr. 28, 2020

(54) THIN SUPPORT STRUCTURE FOR SOLAR COLLECTORS

(71) Applicant: Focal Line Solar LLC, Poplarville, MS (US)

(72) Inventor: John C. Ingram, Poplarville, MS (US)

(73) Assignee: Focal Line Solar LLC, Poplarville, MS (US)

( * ) Notice: Subject to any disclaimer, the term of this patent is extended or adjusted under 35 U.S.C. 154(b) by 264 days.

(21) Appl. No.: 15/016,182

(22) Filed: Feb. 4, 2016

(65) Prior Publication Data

US 2017/0229999 A1 Aug. 10, 2017

(51) Int. Cl.
| | |
|---|---|
| *H02S 40/42* | (2014.01) |
| *H02S 20/32* | (2014.01) |
| *H02S 40/22* | (2014.01) |
| *F24S 30/425* | (2018.01) |
| *F24S 80/30* | (2018.01) |
| *F24S 30/00* | (2018.01) |

(52) U.S. Cl.
CPC ............ *H02S 40/425* (2014.12); *H02S 20/32* (2014.12); *H02S 40/22* (2014.12); *F24S 30/425* (2018.05); *F24S 80/30* (2018.05); *F24S 2030/19* (2018.05)

(58) Field of Classification Search
CPC ........ H02S 40/425; H02S 40/22; H02S 20/32; H01L 31/052; H01L 31/0521; H01L 31/0525; F24J 2002/5458; F24J 2002/5475; F24J 2002/5496; F24J 2/24; F24J 2/14; F24S 10/74; F24S 10/742; F24S 10/744; F24S 10/746; F24S 10/748; F24S 30/425; F24S 80/30

USPC .................................................. 136/243–265
See application file for complete search history.

(56) References Cited

U.S. PATENT DOCUMENTS

| | | | | |
|---|---|---|---|---|
| 1,661,473 | A | | 3/1928 | Goddard et al. |
| 2,181,072 | A | * | 11/1939 | Sayers .................... H02G 1/04 |
| | | | | 254/134.3 PA |
| 3,952,467 | A | * | 4/1976 | Partlow ................. E04H 12/182 |
| | | | | 212/296 |
| 3,973,553 | A | * | 8/1976 | Lanciault ................ F24S 30/20 |
| | | | | 126/634 |
| 3,999,389 | A | * | 12/1976 | Bryce ................... F24S 30/455 |
| | | | | 60/641.15 |
| 4,178,913 | A | | 12/1979 | Hutchinson |
| 4,306,540 | A | | 12/1981 | Hutchinson |
| 4,570,866 | A | * | 2/1986 | Drower ................ B65H 75/368 |
| | | | | 191/12 R |

(Continued)

FOREIGN PATENT DOCUMENTS

| | | | | |
|---|---|---|---|---|
| CN | 103124036 A | * | 5/2013 | |
| JP | 04305956 A | * | 10/1992 | |

OTHER PUBLICATIONS

CN 103124036A English machine translation.*
JP 04-305956A English machine translation.*

*Primary Examiner* — Andrew J Golden
(74) *Attorney, Agent, or Firm* — Sheppard Mullin Richter & Hampton LLP

(57) ABSTRACT

A thin support structure for solar collectors is provided. The support structure includes service lines, such as fluid lines and electrical signal lines, disposed within an interior cavity of the support structure. The movement and flexing of the service lines is accounted for by a pulley assembly having a rotating element, without the need for complex and expensive swivel joints and slip rings.

17 Claims, 11 Drawing Sheets

(56) References Cited

U.S. PATENT DOCUMENTS

| | | | | |
|---|---|---|---|---|
| 4,718,185 A | * | 1/1988 | Conlin | H02S 40/38 |
| | | | | 136/251 |
| 5,404,723 A | | 4/1995 | Parker et al. | |
| 6,045,124 A | * | 4/2000 | Walton | H02G 1/04 |
| | | | | 254/134.3 PA |
| 2008/0048453 A1 | * | 2/2008 | Amick | B82Y 30/00 |
| | | | | 290/44 |
| 2010/0275901 A1 | * | 11/2010 | Simmers | F24J 2/07 |
| | | | | 126/571 |
| 2011/0291405 A1 | * | 12/2011 | Burger | F24S 30/425 |
| | | | | 285/114 |
| 2013/0118555 A1 | * | 5/2013 | Samuels | F24J 2/523 |
| | | | | 136/248 |

\* cited by examiner

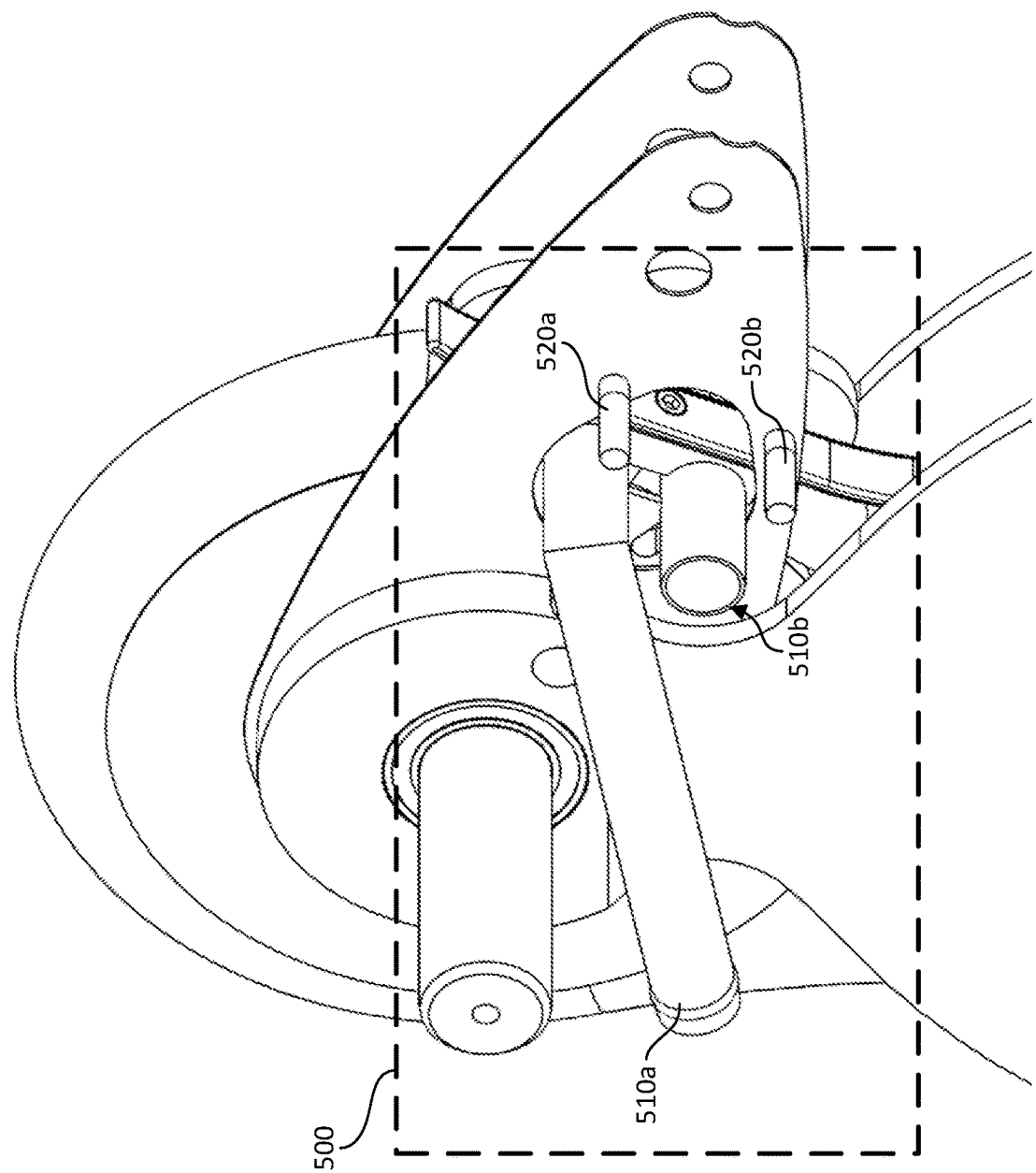

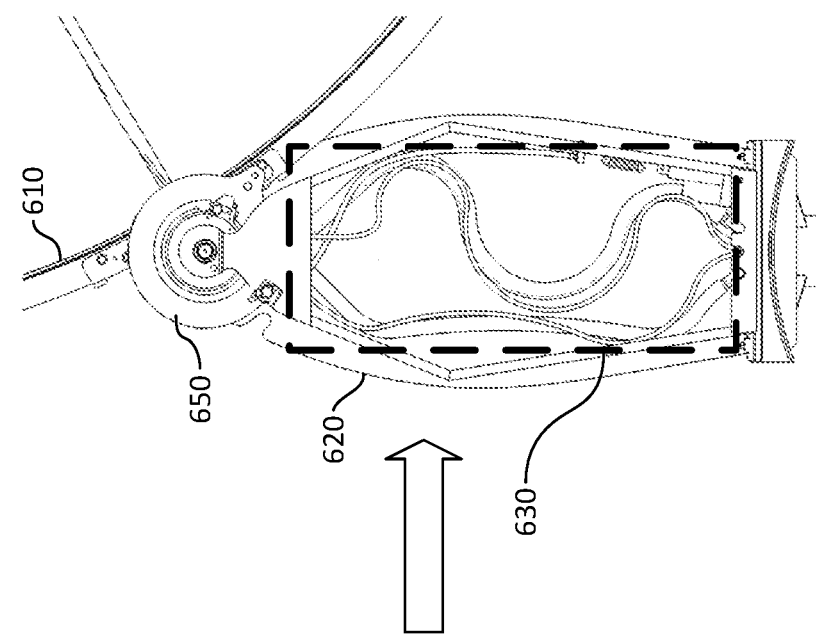
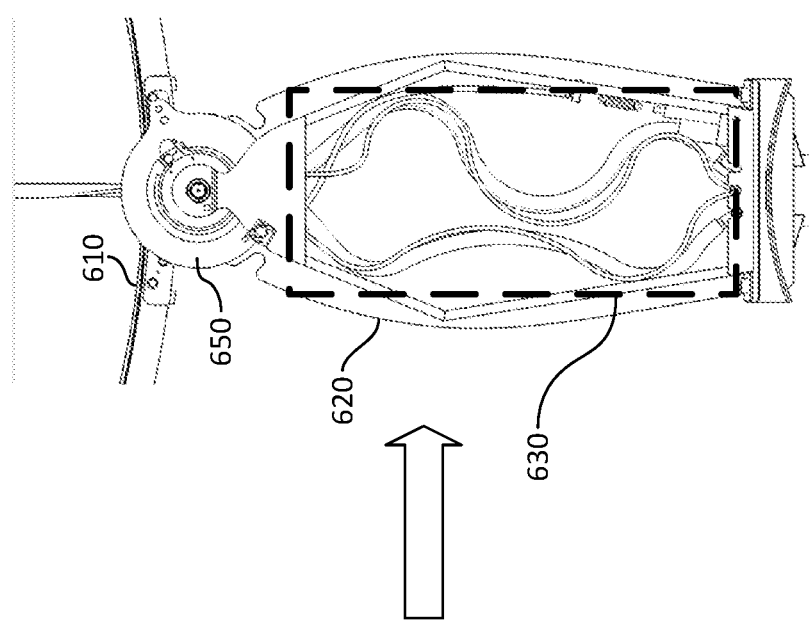
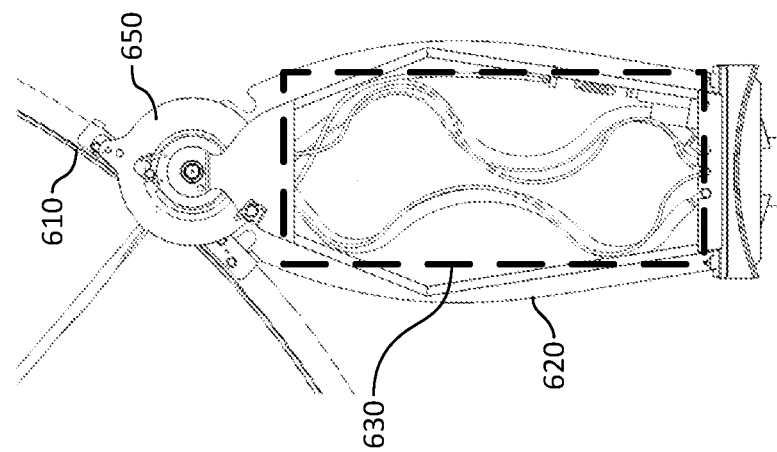

THIN SUPPORT STRUCTURE FOR SOLAR COLLECTORS

TECHNICAL FIELD

The disclosed technology relates generally to support structures for solar collectors, and more particularly, some embodiments relate to thin support structures incorporating braking mechanisms and internal routing of fluid and electrical lines.

DESCRIPTION OF THE RELATED ART

Concentrated solar power requires that the concentration device, such as a solar trough concentrator, track the sun throughout the day. In many applications, a heat transfer fluid flows through a receiver disposed along the focal line of the concentration device, enabling active cooling of photovoltaic ("PV") cells and/or collection of heat into the fluid for use in thermal applications, such as the generation of steam. Where PV cells are utilized, electrical power and signal connections are also necessary. Swivel joints and slip rings are generally used to transport fluid and electrical signals, respectively.

BRIEF SUMMARY OF EMBODIMENTS

According to various embodiments of the disclosed technology, a system is provided for supporting solar collectors. The support structure includes an interior cavity, within which a first service line and a second service line are disposed and routed. The first and second service lines may include one or more fluid lines for circulating heat transfer fluid through a solar concentrator receiver, and or one or more electrical lines for transporting electrical signals to and from the solar collector. The support structure may also have a pulley assembly having a rotating element or elements, wherein the first and second service lines are communicatively coupled to corresponding connectors on the solar collector via the pulley and line connection component, and the first and second service line are configured to reciprocally furl onto and off of the rotating element as the solar collector rotates. The support structure may also have a brake assembly having a disk element coupled to the collector, for prevention of unwanted rotation.

Other features and aspects of the disclosed technology will become apparent from the following detailed description, taken in conjunction with the accompanying drawings, which illustrate, by way of example, the features in accordance with embodiments of the disclosed technology. The summary is not intended to limit the scope of any inventions described herein, which are defined solely by the claims attached hereto.

BRIEF DESCRIPTION OF THE DRAWINGS

The technology disclosed herein, in accordance with one or more various embodiments, is described in detail with reference to the following figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

Some of the figures included herein illustrate various embodiments of the disclosed technology from different viewing angles. Although the accompanying descriptive text may refer to such views as "top," "bottom" or "side" views, such references are merely descriptive and do not imply or require that the disclosed technology be implemented or used in a particular spatial orientation unless explicitly stated otherwise.

FIGS. 5A and 5B are illustrations of an example pulley and line connection components in accordance with embodiments of the technology of the present disclosure.

FIGS. 6A, 6B, 6C illustrate the movement of the service lines during rotation of a solar collector utilizing a support structure in accordance with embodiments of the technology of the present disclosure.

Figure 1:
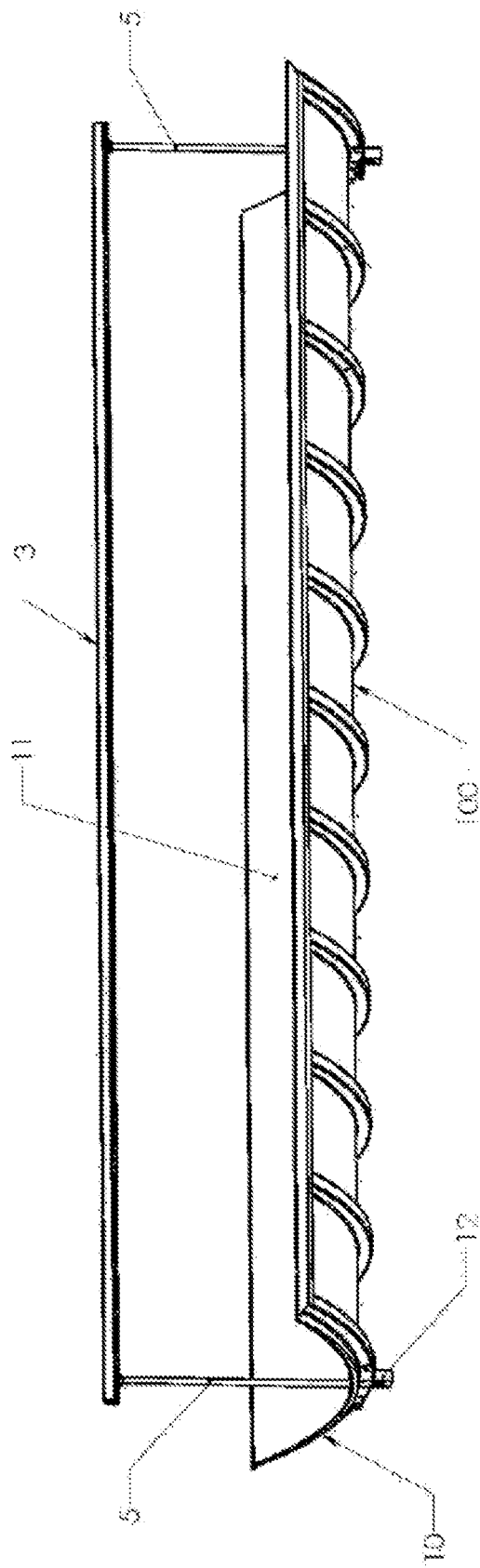
FIG. 1 is an example solar tracking device with which embodiments of the technology disclosed herein may be implemented.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

In order to track the movement of the sun during the day—thus allowing the collection of solar energy, which is converted into usable electricity and/or thermal energy—solar collectors, particularly concentrating collectors, rotate. Due to this rotation, fluid and/or electrical connections must be functional over a wide range of rotation.

As discussed above, heat transfer fluid is often used in solar concentrators for active cooling (i.e., removing excess heat from PV cells) and/or gathering heat in thermal applications (e.g., concentrating solar thermal collection systems). To account for the rotation of the solar concentrator during operation, swivel joints are often employed for the fluid connections to account for changing orientation of the fluid lines relative to the concentrator during rotation. Swivel joints enable rotation of one connection relative to another, allowing for the rotation of the solar concentrator. The design of swivel joints for fluid connections are complex, having to remain liquid tight while allowing freedom to rotate. Such designs generally employ one or more rows of O-rings and/or seals and may utilize bearings adding to the complexity. Accordingly, the cost of such joints is significant, such that it is disproportionately high for the application. Moreover, the complexity of the construction increases the rate of failure over time, as there are more moving components that may fail. Accordingly, the solar concentrating collectors tend to have a longer lifetime than the swivel joints, resulting in a need to replace swivel joints during the useful life of the solar concentrator.

Where the solar collector employs PV cells as well, such as CPVT or pure PV applications, the electrical connections must also account for the rotation of the solar collector. One often used method to address rotation with respect to the electrical connections is the use of slip rings. A slip ring is an electrical connector designed to carry electrical signals between stationary and rotating device. Generally, slip rings include one or more contacts (e.g., metal brushes) which rub against the outer diameter of a metal disk. Also, since the solar collectors live in the open environment, the slip rings must be sealed against moisture intrusion, adding to the complexity. Similar to the swivel joints discussed above, the design of slip rings are complex, resulting in significant cost of fabrication relative to the solar collector. Further, the multiple components increase the potential for failure.

Embodiments of the technology disclosed herein are directed toward a support structure for solar collectors. More particularly, the various embodiments of the technology disclosed herein relate to a support leg with fluid and electrical lines routed internally and in communication with the solar collector without the need to use expensive and complex swivel joints and slip rings employed in traditional solar concentrator installations. In addition to avoiding the need for expensive and complex connectors, embodiments of the technology disclosed herein enable solar collectors to be stored in an inverted (i.e., face down) position. When inverted, the receiver and mirror or sun receiving surface are rotated 180 degrees from the noon position, with the receiver in its closest possible position relative to the ground. This inverted storage minimizes dust collection on the working surfaces of the solar collectors and the dew gluing problem. The dew gluing problem is when the collectors remain face up or partially face up overnight, whereby the morning dew collects on the sun receiving surface with accumulated dust. As the dew dries in the sunlight, the dust particles become bonded to the surface and are much harder to clean. Through inverted storage, this dew problem may be minimized. Moreover, inversion limits external damage caused by weather (e.g., hail) or other external impacts to any working surfaces by minimizing exposure of the working surfaces.

For ease of discussion, embodiments of the technology disclosed herein are described with respect to embodiments employed with trough solar concentrators. An example trough solar concentrator 100 with which embodiments of the technology disclosed herein may be employed is shown in FIG. 1. As shown, a trough concentrator 10 includes a back shell 100, a mirror 11, a receiver 3 and receiver supports 5, and mounting and pivot points 12. This description should not be read to limit the scope of the technology of the present disclosure. The technology of the present disclosure is applicable to other types of solar collectors utilizing fluid and/or electrical lines, such as non-concentrated PV modules and concentrators without mirrors.

Figure 2:
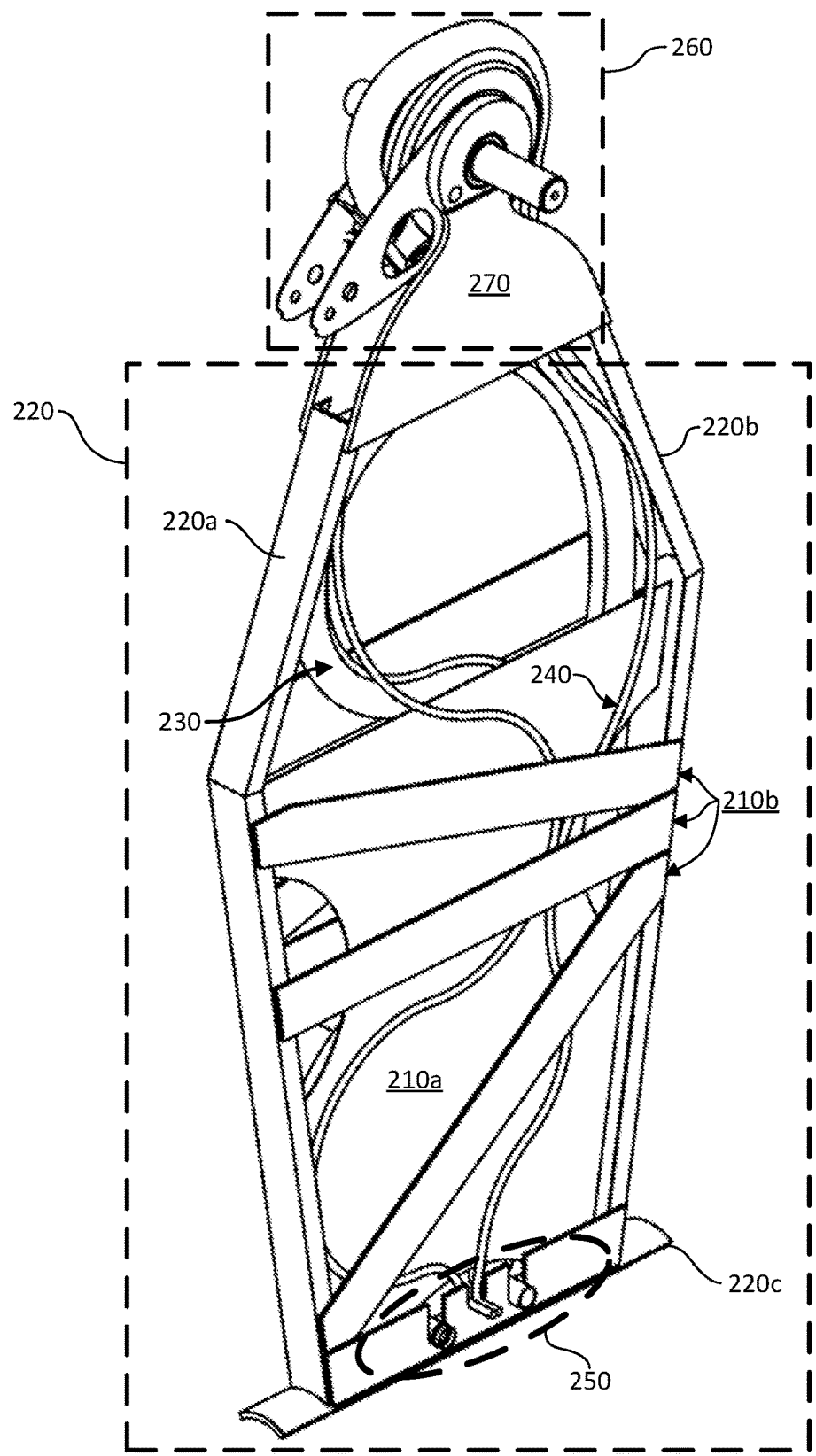
FIG. 2 is an example support structure in accordance with embodiments of the technology of the present disclosure.

FIG. 2 illustrates an example support structure 200 in accordance with embodiments of the technology disclosed herein. As illustrated, the support structure 200 is designed to include a novel fluid and electrical connection system, enabling the support structure 200 to maintain a thin profile. When disposed in between two solar collectors, such as the example solar trough concentrator discussed above with respect to FIG. 1, the thin profile decreases the gap between each concentrator. The smaller gap reduces the effect of induced shadowing on the receiver by limiting the space and thereby maximizing light rays reflected off neighboring concentrator which subsequently impact on the receivers of the next concentrator in series. As will be discussed in greater detail below, the thin profile of embodiments of the technology of the present disclosure is possible due to the pulley system, enabling routing of fluid and electrical lines without the need for swivel joints or slip rings—each of which require more space between neighboring concentrator for functional clearance.

The support structure 200 includes a frame 220. In various embodiments, the frame 220 comprises two legs 220a, 220b and a base 220c. The support structure 200 may further include one or more braces 210b. The braces may provide further structural support to the frame 220 in some embodiments. The braces may extend from one leg 220a to the other leg 220b, from the base 220c to one or both of the legs 220a, 220b, or a combination thereof in various embodiments. In some embodiments, the braces 210b may be a single large extensive brace, replacing multiple instances of 220b, and may appear to be more of a full wall. In some embodiments, the braces 210b may define an interior cavity of the support structure 200, within which service lines 230, 240 may be disposed. In other embodiments, the service lines 230, 240 may be disposed on the outside of the braces 210b. In such embodiments, although the service lines 230, 240 may be disposed outside of the braces 210b, the thin profile of the support structure 200 is not adversely impacted. Non-limiting examples of materials comprising the frame 220 include: steel; stainless steel; plastics; aluminum; any metal alloy; zinc; composite materials, such as fiberglass, Kevlar, carbon fiber; fibrous composite; or a combination thereof. The frame 220 may be fabricated utilizing different fabrication techniques, including but not limited to: welding; adhesive bonding; bolting; riveting; molding or layup of composites; or a combination thereof. The components of the frame 220 may comprise: tubes; box tubes; C channels; stamped sheet metal; beam sections; or a combination thereof.

A pulley assembly 260 incorporated into the support structure 200 accounts for the movement and flexing of the service lines 230, 240 as the connected solar collector rotates during tracking of the sun. As illustrated in FIG. 2, the pulley assembly 260 is incorporated into the support structure 200 within a pulley mount 270, the pulley mount 270 having one or more faces. In some embodiments, the pulley mount 270 may be integrated into the legs 220a, 220b, or connected to the frame 220 post manufacture of the frame 220. The pulley assembly 260 will be discussed in greater detail with respect to FIGS. 3 and 4.

To enable easy connection of service lines 230, 240, the support structure 200 may include an outlet section 250. In various embodiments, the outlet section 250 may be disposed at the base 220c of the frame 220. In embodiments where the service lines 230, 240 are disposed within the interior cavity, the outlet section 250 may enable access to the set of service lines 230, 240 disposed within the interior cavity. In other embodiments, the outlet section 250 may serve as a central location to connect the service lines 230, 240 to other external lines. The number of connections included in the outlet section 250 may depend on the number of service lines disposed within the support structure. In some embodiments, the outlet section 250 may include five connections associated with the disposed service lines: a fluid in connector for a first fluid line; a fluid out connecter for a second fluid line; and two electrical power lines and one signal line (out of view) for the electrical lines. In embodiments with only one fluid line disposed, the outlet section 250 may include four or fewer connections. In various embodiments, the outlet section 250 may include two connections: one for a single fluid line; another for a single electrical line. The outlet section 250 may include additional connections in various embodiments, based on the number of service lines 230, 240 are implemented with the support structure 200. Although the outlet section 250 is shown as being disposed at the base 220c of the support structure 200 in FIG. 2A, other embodiments might have the outlet section 250 disposed elsewhere on the support structure. For example, in some embodiments the outlet section 250 may be disposed on either of the legs 220a, 220b of the frame 220. Various embodiments of the support structure 200 may include one or more internal structures 210a, which may serve to separate service lines 230, 240.

Figure 3A:
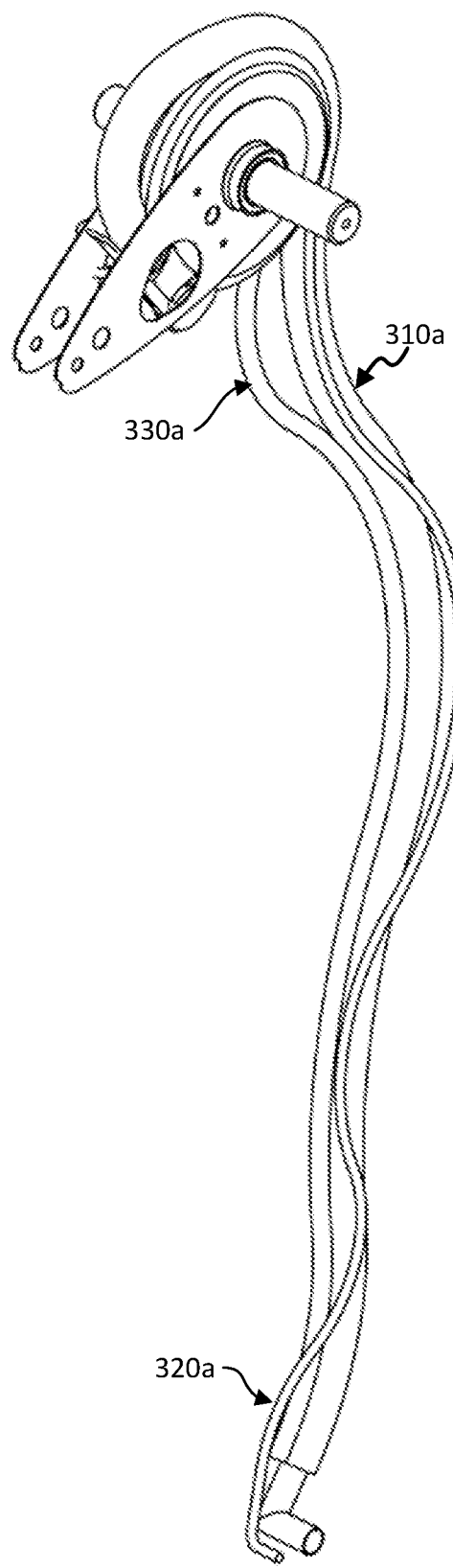
FIG. 3A is an illustration of an embodiment of the service lines as disposed within a support structure, but with the support structure removed to show the tubes and wires, in accordance with embodiments of the technology of the present disclosure.
Figure 3B:
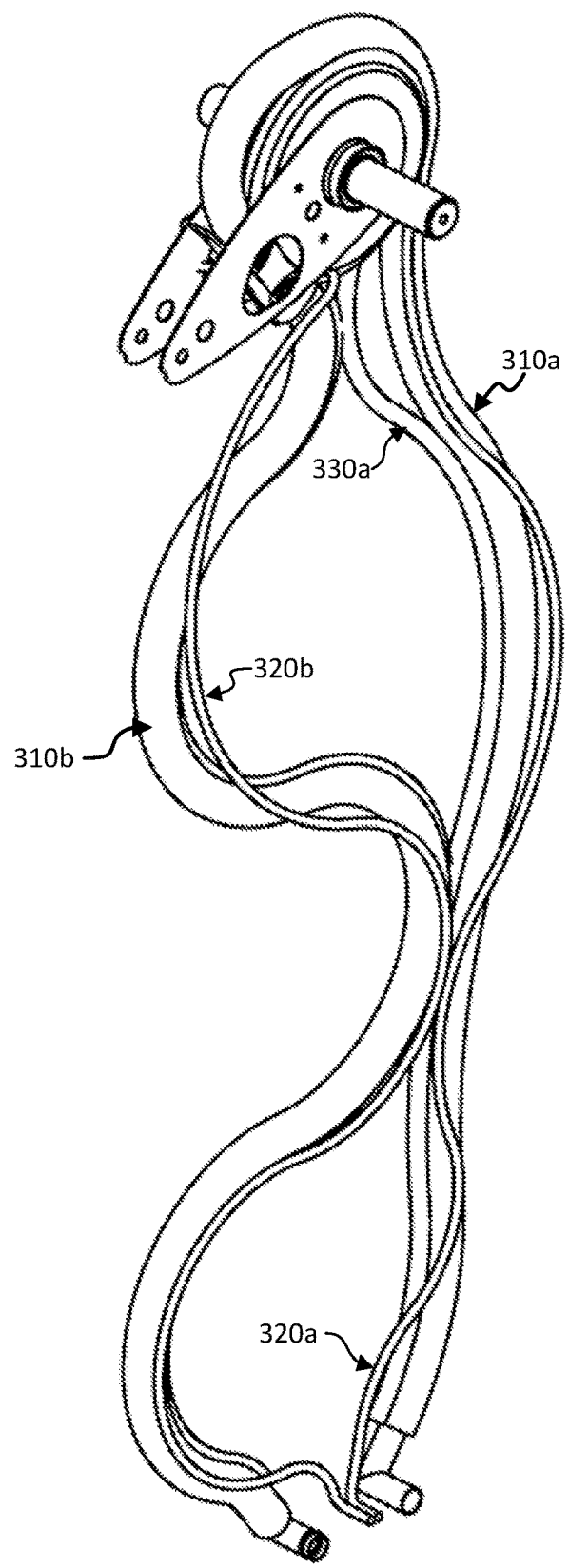
FIG. 3B is an illustration of another embodiment of the service lines as disposed within a support structure, but with the support structure removed, in accordance with embodiments of the technology of the present disclosure.

As discussed above, service lines may be disposed within the interior cavity 210 in various embodiments. FIG. 3A illustrates set of service lines 300 in accordance with embodiments of the technology disclosed herein. The set of service lines 300 may be disposed in various embodiments within the interior cavity of a support structure, such as the support structure 200 discussed above with respect to FIG. 2. The set of service lines 300 illustrated in FIGS. 3A and 3B are shown with the support structure removed, for clarity. Although discussed with respect to service lines being disposed within the interior cavity of the support structure, a person of ordinary skill will appreciate that the same description is applicable for service lines which are disposed as in an exterior cavity with the braces or walls, discussed with respect to FIG. 2, disposed in the middle of the structure or off to one side, leaving essentially a concave shape(s) with which to dispose the service lines.

As illustrated in FIG. 3A, the set of service lines 300 may include a fluid line 310a and an electrical line 320a. The fluid line 310a enables fluid to flow into or out of a fluid tube associated with the receiver of a solar collector, such as receiver 3 of the example solar trough concentrator discussed with respect to FIG. 1. Non-limiting examples of heat transfer fluids that may be transported via fluid line 310a include: water; glycol mixtures, such as ethylene and propylene glycol; hydrocarbon oils, such as paraffin hydrocarbons, refined mineral oils, and synthetic hydrocarbons; or refrigerants, such as ammonia, and fluorocarbons. In various embodiments, the fluid line 310a may be plastic, rubber, Silicon, metal bellows, metal flex line or other tubing. In some embodiments, the fluid line 310a may be reinforced Silicon tubing.

In some embodiments, the set of service lines illustrated in FIG. 3A may include an electrical line 320a. For concentrated PV devices, the electrical line 320a may be included to transfer electrical power generated by the PV cells. In some embodiments, the electrical line 320a may include signal connections to provide power to electrical components associated with the support structure, such as to connect PV cells of neighboring solar collectors together in series. In various embodiments, the electrical line 320a may include more than one signal line, such that one or more signal wires may be included within the electrical line 320a. In various embodiments, the electrical line 320a may comprise one or more different wire gauge sizes, depending on the electrical requirements for a particular application. In some embodiments, the set of service lines illustrated in FIG. 3A may include an additional wash fluid line 330a for transport of washing fluid for the mirror or other solar receiving surface.

As illustrated in FIG. 3A, a single cooling fluid line 310a, a single wash fluid line 330a and single electrical line 320a may be used. In some embodiments, additional service lines may be needed, such as installations where each pair of solar concentrator or solar device is a standalone system. FIG. 3B illustrates another example of the set of service lines 350 in accordance with embodiments of the technology disclosed herein. The set of service lines 350 illustrated in FIG. 3B includes additional service lines compared to the set of service lines 300 illustrated in FIG. 3A. As shown in FIG. 3B, the set of service lines 350 includes a first fluid line 310a and a first electrical line 320a, and second fluid line 310b and second electrical line 320b. In various embodiments, the first fluid line 310a and first electrical line 320a may serve as inlet service lines, enabling heat transfer fluid and electrical signals, respectively, while the second fluid line 310b and 320b may serve as outlet service lines. In application where the cooling or heat transfer fluid lines are not serially connected; it may be necessary to have the fluid lines come in and out of the same support structure. In such case it will be necessary to configure the as in FIG. 3B, as noted earlier, in a reciprocal arrangement. This arrangement may also be necessary in 2 axis tracking applications.

Figure 4:
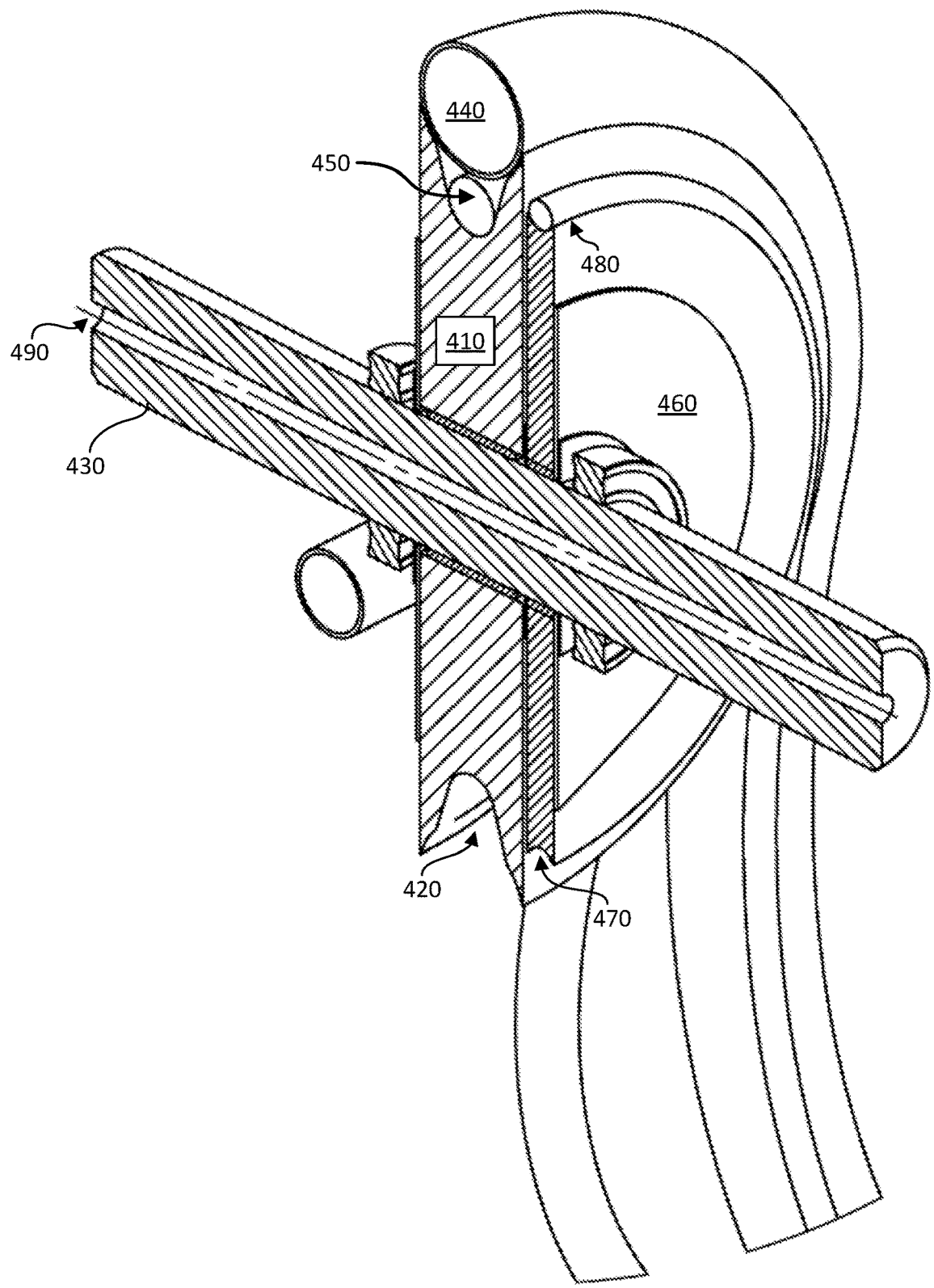
FIG. 4 is a cross-sectional view of an example pulley assembly in accordance with embodiments of the technology of the present disclosure.

FIG. 4 is a cross-sectional view of an example pulley assembly 400 in accordance with embodiments of the technology of the present disclosure. As illustrated, the pulley assembly 400 includes a rotating element 410 having a groove 420. Non-limiting examples of materials of which the rotating element may be made include: steel; stainless steel; aluminum; zinc; metal alloys; fiberglass; plastic; or other fibrous composite material. The rotating element 410 rotates around a shaft 430. In various embodiments, the shaft 430 may be connected to a pivot point of the solar collector, such as the pivot points 12 of the example solar trough concentrator discussed with respect to FIG. 1. In some embodiments, the shaft 430 may be associated with the pulley assembly 400 only, unconnected to the solar collector.

The shaft 430 may include a hole 490 in various embodiments, which runs the length of the shaft 430. The hole 490 provides assistance with alignment of a string of solar concentrators and support structures in an installation. For example, a laser may be shone from the hole 490 of a first support structure, and through each subsequent support structure shaft. Using the holes 490 provides an indication that all the solar concentrators in the installation are aligned properly when the laser is capable of passing through the holes 490 of all the support structures (from the first to the last in a string of concentrators).

The groove 420 serves as a guide for the set of service lines, such as fluid line 440 and the electrical line 450. Fluid line 440 and electrical line 450 may be the fluid line 310a and electrical line 320a (or 330a) discussed with respect to FIGS. 3A and 3B. In various embodiments, the groove 420 may be tapered contour such that a smaller service line (e.g., the electrical line 450) may fit lower inside the groove 420, with a larger service line (i.e., the fluid line 440) capable of resting in the larger upper contoured of the opening of the groove 420. In some embodiments, the smaller service line may be a wash fluid line, similar to the wash fluid line discussed with respect to FIG. 3A. In some embodiments, the groove 420 may be configured to provide a space in between the service lines 440, 450 such that the service lines are not touching. In some embodiments, the groove 420 may be configured to enable more than two service lines to fit in the groove 420. In this way, a single rotating element 410 can account for the movement of multiple service lines. In various embodiments, more than one rotating element may be included in a support structure, similar to the support structure 200 discussed with respect to FIG. 2A. For example, a second rotating element 460 may be included, having a second groove 470 configured to provide support for a third or more service line(s) 480. In some embodiments, the third service line 480 may be another electrical line, similar to the electrical line 450. In other embodiments, the third service line 480 may be another fluid line, similar to the fluid line 440. Although the second rotating element 460 is shown as a smaller disk than the first rotating element 410, the illustrated embodiment should not be interpreted as limiting the scope of the present disclosure. A person of ordinary skill in the art would appreciate that the second rotating element 460 may be similar to the first rotating element 410 in various embodiments. In various embodiments, the second rotating element 460 may be disposed on one or more bearings, enable independent rotation around the shaft 430. In some embodiments, second rotating element 460 may rotate in sync with first rotating element 410. In some embodiments, second rotating element 460 may rotate independently of first rotating element 410. In some embodiments, first rotating element 410 may be connected to a first concentrator nearest it and second rotating element 460 may be connected to a second concentrator nearest it.

Figure 5B:
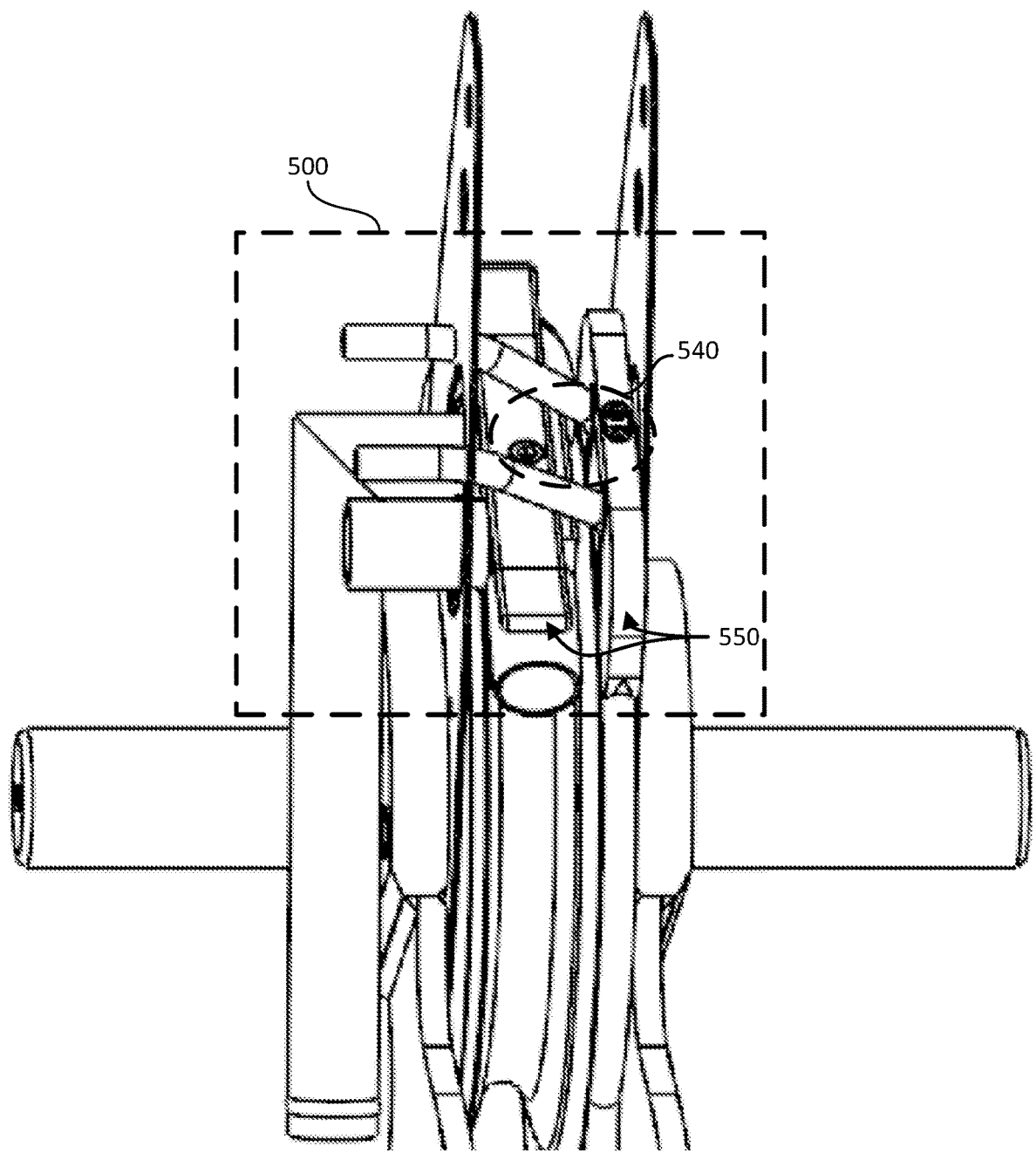

FIGS. 5A and 5B illustrate an example pulley and line connection components 500 of an example pulley assembly in accordance with embodiments of the technology of the present disclosure. The example pulley and line connection component 500 shown in FIGS. 5A and 5B corresponds with a connection component used where the set of service lines include first and second service lines, such as the set of service lines 350 discussed with respect to FIG. 3B. Although described with respect to the set of service lines 350, the description of components of the pulley and line connection component 500 are applicable to other embodiments, such as embodiments with the set of service lines 300 of FIG. 3A. A person of ordinary skill would appreciate that in such embodiments the connection component may exclude the second set of connectors 510b, 520b shown in FIG. 5A (discussed in greater detail below).

As illustrated in FIG. 5B, the pulley and line connection component 500 secures the service lines to the rotating element(s) of the pulley assembly, as well as serving as the transfer point connecting the service lines and the solar collector. In various embodiments, the service lines are secured to the rotating element by connecting plates 550. Connecting plates 550 may be designed based on the type of service line intended to be connected. In various embodiments, the connecting plates 550 may be made of steel, stainless steel, aluminum, copper, metal alloys, carbon fiber, plastic, or other fibrous composite, or a combination thereof. In some embodiments, the connecting plates 550 may include securing components 540, designed to secure the connecting plate in place to the rotating elements. In various embodiments, the securing components 540 may include, but are not limited to: bolts; screws; clamps; clamp collars; or other locking mechanisms.

As illustrated in FIG. 5A, the pulley and line connection component 500 may include line connectors 510, 520 for connecting the service lines to the solar collector, as illustrated in FIG. 5A. Electrical line connectors 520a, 520b may be configured to mate with corresponding connectors disposed on the solar collector. Fluid line connectors 510a, 510b may be configured to mate with corresponding fluid connections disposed on the solar collector. In some embodiments, fluid line connector 510a may be a fluid intake connector from the collector such that heat transfer fluid may flow from a fluid output of the solar collector into the fluid line such that heated fluid is removed from the solar collector. In some embodiments, fluid line connector 510b may be a fluid outlet connector from the leg such that heat transfer fluid flows from the fluid line disposed in the support structure to a fluid intake routed to the receiver of the solar collector. The connections between the solar collector and the pulley assembly are all static, meaning there is no relative movement between them.

As discussed above, traditional solar concentrators utilize swivel joints and/or slip rings to account for the movement and relative rotation of fluid lines and electrical lines caused by the rotation of the solar collector. By employing a support structure in accordance with embodiments of the technology of the present disclosure, cheaper, more efficient, and easier to maintain solar collector installations are possible. The pulley assembly of the support structure accounts for the rotation of the solar concentrator without the need for expensive and complex swivel joints or slip rings to transfer heat transfer fluid or electrical signals from the rotating solar concentrator. Moreover, the profile of the pulley assembly and the support structure reduces the clearance space necessary between neighboring solar concentrator, as there is no need to ensure enough space for protruding swivel joints and pipes to be functional.

FIGS. 6A, 6B, and 6C illustrate how movement of the service lines is capable, utilizing the pulley assembly of the support structure in accordance with the embodiments of the present disclosure. To help illustrate the type of motion, the illustrated examples utilize the set of service lines 350 discussed with respect to FIG. 3B. The support structure 620 is illustrated without any outside covers or support structures to enable a clear view of the service lines disposed within the interior 630 of the support structure 620. Although discussed with respect to embodiments of the support structure 320 with the service lines disposed within the interior cavity, the same type of motion is applicable to other embodiments where the service lines are not disposed within the interior cavity.

In the illustrated example of FIGS. 6A, 6B, and 6C, the support structure 620 is shown disposed on one end of a solar trough concentrator, similar to the solar trough concentrator 100 discussed with respect to FIG. 1. In some embodiments, the support structure 620 may be implemented in conjunction with an integrated drive leg as described in related co-pending application U.S. application Ser. No. 14/948,676, filed Nov. 23, 2015. The solar collector 610 moves from a first position in FIG. 6A, to an intermediate position in FIG. 6B, to a final position in FIG. 6C. As the solar concentrator 610 rotates, the service lines in the interior 630 can be seen in changed position, as the slack of the left-side service lines is reduced as the pulley assembly furls the left-side service lines onto itself, while the slack of the right-side service lines is increased as the pulley assembly unfurls them. FIGS. 6A, 6B, and 6C also illustrate the brake 650, which will be discussed in more detail with regard to FIG. 8.

Figure 7A:
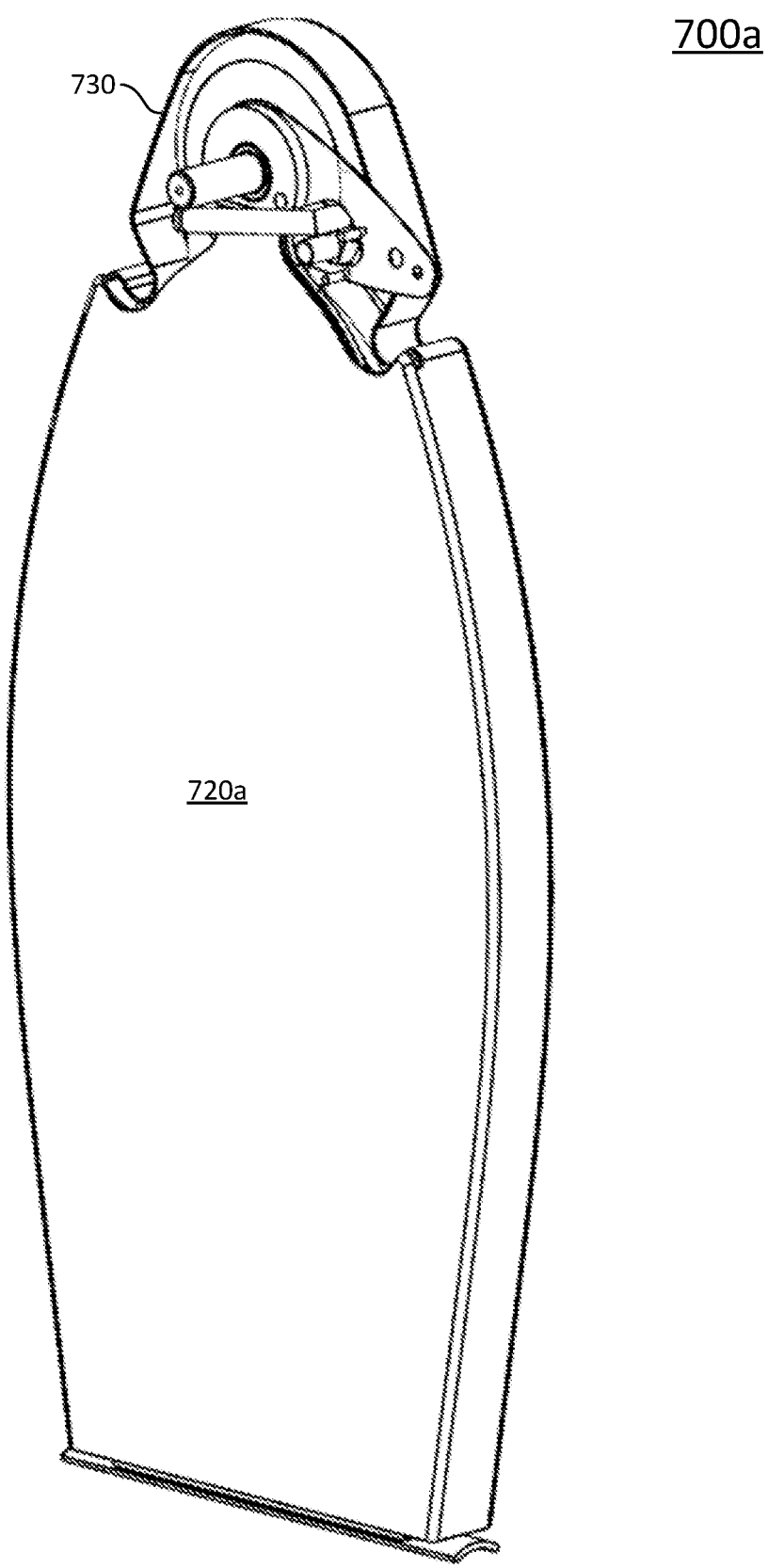
FIG. 7A illustrates an example support structure with covers also referred to as side panels in accordance with embodiments of the technology of the present disclosure.
Figure 7B:
FIG. 7B illustrates another example support structure with covers also referred to as side panels in accordance with embodiments of the technology of the present disclosure.

With respect to FIG. 2, the support structure was discussed as having one or more braces. In some embodiments, one or more side panels may be used, in lieu of or in combination with the one or more braces, to define the cavity. FIGS. 7A and 7B illustrate an example support structure with covers or side panels in accordance with embodiments of the technology disclosed herein. As illustrated in FIG. 7A, an example support structure 700a has a side panel 720a connected to the frame (not seen). The side panels 720a may be disposed on both sides of the support structure 700a. The side panels 720a may serve to protect the service lines from damage caused by sunlight, dirt, or other contaminants, in addition to protecting the service lines from damage caused by contact with external objects. In some embodiments, the side panels 720a may also help to constrain and guide the service lines during operation, ensuring that the service lines furl properly. In some embodiments, the side panels 720a may also be insulated. Moreover, the side panels 720a (and 720b discussed with respect to FIG. 7B) may also allow for space to add branding or advertisements to the support structure 700a. The side panels 720a may comprise, but not limited to, plastic, metal, composite materials, or a combination thereof. The side panels 720a may be constructed through stamping, layup, or molding process, similar to the methods discussed above with respect to FIG. 2.

In some embodiments, the cover 720b may include a line guard 730, often referred to as a shroud, which covers to the top of each frame and is disposed above the pulley assembly. The line guard 730 may be shaped to follow the curvature of the pulley and line assembly. The line guard 730 may be implemented with embodiments of the technology disclosed herein similar to the support structure discussed above with respect to FIG. 2.

FIG. 7B illustrates another example side panel in accordance with embodiments of the technology disclosed herein. In some embodiments, cover 720b of FIG. 7B may mate with 720a of FIG. 7A, in a clamshell closure to enclose the frame, as in FIGS. 7A and 7B. In some embodiments, side panel 720a may be disposed similarly on both sides of frame, leave the edges of frame exposed (not shown). As illustrated, the support structure 700b includes a side panel 720b that helps to not only define the interior cavity (like the side panel 720a of FIG. 7A), but also covers the pulley assembly. In this way, side panels 720b allow for enclosure of the inner workings of the support structure. As illustrated in FIG. 7B, the side panel 720b may connect to both the frame and the line guard 730 in some embodiments. In some embodiments, line guard 730 is integral to cover 720b. Moreover, the side panels 720b illustrate the branding potential discussed above with respect to FIG. 7A.

Use of side panels 720a, 720b provides an area for advertising or branding to occur, increasing the utility of the support structure in accordance with embodiments of the present disclosure. In some embodiments, a company name, logo, or product name may be disposed on the surface of the side panels 720a and/or 720b. In this way, companies could create side panels 720a, 720b emblazoned with marketing materials. In various embodiments, the name, logo, or product name may be molded into the side panels 720a, 720b.

In various embodiments, one or more side panels (not pictured) may be used, alone or in conjunction with the one or more braces 210b, as discussed with respect to FIG. 2, to define the interior cavity. The side panels may be placed on either side of the support structure 200 of FIG. 2, or on both sides, in some embodiments. In various embodiments, the side panels, similar to the braces 210b, may serve as strength members for the support structure 200. In various embodiments, the side panels 720a & 720b may act as an exterior covers, enclosing the interior cavity.

Figure 8:
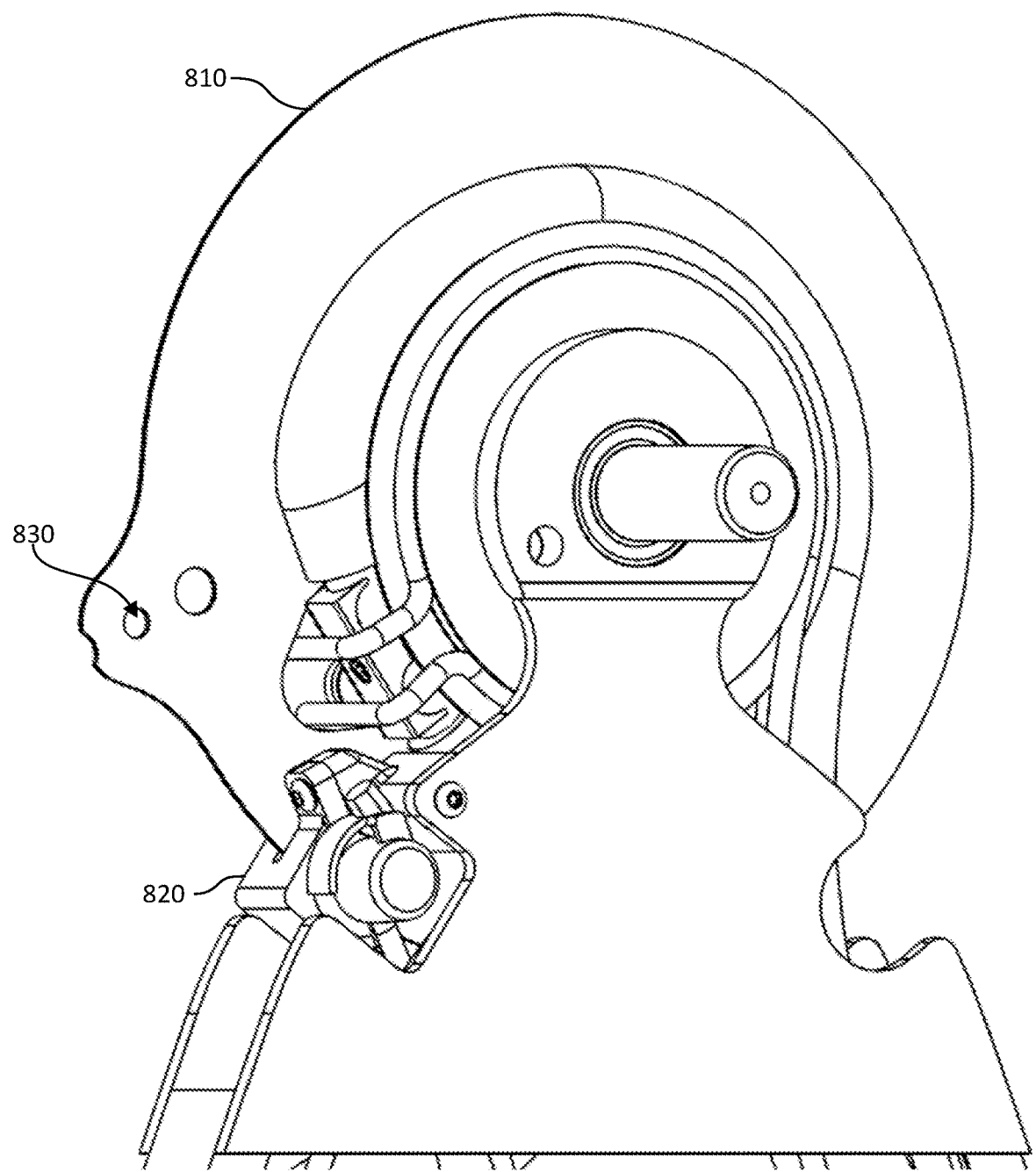
FIG. 8 illustrates an example braking system integrated into the support structure in accordance with embodiments of the technology of the present disclosure.

In various embodiments of the disclosed technology, a brake system may be included in the support structure. Although omitted from FIGS. 2-5B, for clarity of illustration, the disk brake 650 is illustrated in FIGS. 6A, 6B, and 6C. FIG. 8 illustrates an example braking system 800 in accordance with embodiments of the technology disclosed herein. The example braking system 800 incorporates the disk brake 650 illustrated in FIGS. 6A, 6B, and 6C, to enable the collector to be locked from unwanted rotation and to counteract vibration and/or oscillation issues, without the need to increase the torsional stiffness of the collector structure itself. This helps limit cost, as the greater demands placed on the collector, the more expensive it becomes.

The example braking system 800 comprises two primary components, disk brake 810 and caliper 820. In some embodiments brake component 800 may be included in the support structure design. Braking system 800 is designed to lock the collector from unwanted rotation. Given that, in many cases, collectors are driven from one end only, and in some cases this support may be 6 meters or more away, wind induces forces may cause displacement, vibration and or oscillations in the collectors. Disk brake 810 is located on the center shaft and is connectively attached to and rotates with the collector. In some embodiments, the disk brake 810 may be connected to a rotating element, such as the rotating element discussed with respect to FIG. 4 above, enabling the disk brake 810 to rotate with the motion of the collector. Caliper 820 is rigidly attached to the frame. When caliper 820 is actuated, disk brake 810 (and thus the collector) is prevented from rotating. Disk brake 820 is connected to the collector by a coupling component (not shown), which bolts to disk brake 810 through hole(s) 830 located on disk brake 810. Disk brake 810 may be made from steel, stainless steel, any alloy metal, aluminum, titanium, ceramic or composite material. In some embodiments, disk brake 810 may be directly bolted to the collector via hole 830. In some embodiments support frame may be disposed between two collects or at the end of a single collector. The inclusion of a braking system 800 may eliminate or greatly reduce wind induced movement without the demand for greater torsional stiffness of the collector structure. In some embodiments, braking system 800 is incorporated with the service lines, previously mentioned. In some embodiments the braking system 800 is implemented without the service lines.

In some embodiments, the disk brake 810 may be integrated into the frame of the support structure, such as the frame 220 discussed above with respect to FIG. 2, separate from the pulley. In some embodiments, the disk brake 810 may be integrated completely without a pulley assembly. In other embodiments, the disk brake 810 may be integrated into the pulley assembly, such as the pulley assembly discussed with respect to FIGS. 4, 5A, and 5B.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A system, comprising:
   a support structure having a frame;
   a set of flexible service lines comprising a first service line and a second service line; and
   a pulley assembly having a rotating element and a pulley and line connection component comprising at least two connecting plates comprising a first and second securing components, the pulley assembly being incorporated into the support structure;
   wherein the at least two connecting plates of the pulley and line connection component are configured to secure the first and second service lines to the rotating element via the first and second securing components;
   wherein the set of service lines are communicatively coupled to corresponding connectors on a solar collector via the pulley and line connection component, and wherein the set of service lines are configured to furl onto and off of the rotating element of the pulley assembly as the solar collector rotates.

2. The system of claim 1, wherein the first service line comprises a first fluid line, and the second service line comprising one or more electrical signal lines.

3. The system of claim 1, wherein the frame is covered by one or more side panels.

4. The system of claim 3, wherein the panel comprises a company name, logo, or product name disposed on the surface or molded into the panel.

5. The system of claim 1, wherein the support structure further comprising an interior cavity defined by the pulley assembly, the frame, and at least one of: one or more braces, or one or more side panels.

6. The system of claim 1, wherein the pulley assembly further comprising a shaft.

7. The system of claim 6, wherein the shaft is connected to a pivot point of the solar collector.

8. The system of claim 6, wherein the shaft further comprising a through hole.

9. The system of claim 1, wherein the rotating element disposed on one or more bearings.

10. The system of claim 1, wherein the rotating element comprising a groove.

11. The system of claim 10, wherein the groove is tapered.

12. The system of claim 11, wherein the groove being contoured and configured such that the second service line fits inside the groove and the first service line fits in a position above the second service line.

13. The system of claim 12, further comprising a brake system comprising a disk brake and a caliper.

14. The system of claim 13, wherein the support structure is disposed between two collectors, and the disk brake is connected to each of the two collectors.

15. The system of claim 13, wherein the disk brake is connected to the rotating element.

16. The system of claim 1, wherein the pulley assembly further comprising a second rotating element.

17. The system of claim 12, wherein the first service line configured to transport a heat transfer fluid, the heat transfer fluid comprising one of: water; ethylene glycol; propylene glycol; hydrocarbons; silicone oil; refined mineral oils; synthetic hydrocarbons; ammonia; fluorocarbons; or any commercial heat transfer fluid.

* * * * *